(12) United States Patent
Park et al.

(10) Patent No.: US 11,560,488 B2
(45) Date of Patent: Jan. 24, 2023

(54) ULTRAVIOLET CURABLE INK COMPOSITION, METHOD FOR MANUFACTURING BEZEL PATTERN IN DISPLAY SUBSTRATE BY USING SAME, AND BEZEL PATTERN MANUFACTURED THEREBY

(71) Applicant: LG Chem, Ltd., Seoul (KR)

(72) Inventors: Sungeun Park, Daejeon (KR); Jaehyun Yoo, Daejeon (KR); Areum Kim, Daejeon (KR); Joonhyung Kim, Daejeon (KR)

(73) Assignee: LG Chem, Ltd.

( * ) Notice: Subject to any disclaimer, the term of this patent is extended or adjusted under 35 U.S.C. 154(b) by 754 days.

(21) Appl. No.: 16/491,770

(22) PCT Filed: Dec. 26, 2018

(86) PCT No.: PCT/KR2018/016617
§ 371 (c)(1),
(2) Date: Sep. 6, 2019

(87) PCT Pub. No.: WO2019/132489
PCT Pub. Date: Jul. 4, 2019

(65) Prior Publication Data
US 2020/0291252 A1    Sep. 17, 2020

(30) Foreign Application Priority Data

Dec. 27, 2017 (KR) .................. 10-2017-0180728

(51) Int. Cl.
| | | |
|---|---|---|
| *C09D 11/101* | (2014.01) | |
| *C08G 65/08* | (2006.01) | |
| *C08G 65/18* | (2006.01) | |
| *C08G 65/26* | (2006.01) | |
| *C08K 5/17* | (2006.01) | |
| *C09D 11/102* | (2014.01) | |
| *C09D 11/324* | (2014.01) | |

(Continued)

(52) U.S. Cl.
CPC .............. *C09D 11/101* (2013.01); *B41J 2/01* (2013.01); *B41J 2/2107* (2013.01); *B41J 11/002* (2013.01); *C08G 65/08* (2013.01); *C08G 65/18* (2013.01); *C08G 65/26* (2013.01); *C08K 5/17* (2013.01); *C09D 11/102* (2013.01); *C09D 11/324* (2013.01); *G02F 1/133308* (2013.01)

(58) Field of Classification Search
CPC ... B41J 2/01; B41J 2/211; B41J 2/1433; B41J 2/17; B41J 2/17593; B41J 2/2107; B41J 2/1755; B41J 2/2114; B41J 2/2117; B41J 2/2056; B41J 2/21; B41J 2/0057; B41J 3/60; B41J 2002/012; B41J 2/04598; B41J 2/04588; B41J 2/04595; B41J 2/04586; B41J 2/14274; B41J 2/1623; B41J 2202/00; B41J 2202/03; B41J 2/14201; B41J 2/045; B41J 11/0015; B41J 11/002; B41J 2/04581; B41J 2/055; B41J 2/16538; B41J 2002/16502; B41J 29/02; B41J 2/17513; B41J 2/17509; B41J 29/13; B41J 2/17553; B41J 2/1606; B41J 2/1642; B41J 2/1609; B41J 2/164; B41J 2/162; B41J 2/161; B41J 2/19; B41J 15/04; B41J 25/001; B41J 25/34; B41J 25/003; B41J 25/312; B41J 2025/008; B41J 2202/21; B41J 2/17596; B41J 2/16508; B41J 2/1652; B41J 2/175; B41J 2/17563; B41J 3/4078; B41J 11/0021; C09D 11/36; C09D 11/40; C09D 11/30; C09D 11/38; C09D 11/32; C09D 11/322; C09D 11/324; C09D 11/328; C09D 11/101; C09D 11/102; C09D 11/005; C09D 11/54; C09D 11/52; C09D 11/106; C09D 11/326; C09D 11/107; C09D 11/03; C09D 11/037; C09D 11/033; B41M 5/0011; B41M 5/0017; B41M 5/0023; B41M 5/0047; B41M 7/00; B41M 7/0072; B41M 5/52; B41M 5/5218; B41M 5/5227
See application file for complete search history.

(56) References Cited

U.S. PATENT DOCUMENTS

| | | | |
|---|---|---|---|
| 2003/0149127 A1* | 8/2003 | Jansen | ................ C08F 230/02 522/178 |
| 2004/0214945 A1 | 10/2004 | Uozumi | |

(Continued)

FOREIGN PATENT DOCUMENTS

| | | |
|---|---|---|
| CN | 101041754 A | 9/2007 |
| CN | 102241914 A | 11/2011 |

(Continued)

OTHER PUBLICATIONS

International Search Report for Application No. PCT/KR2018/016617, dated Apr. 29, 2019, pp. 1-3.

(Continued)

*Primary Examiner* — Manish S Shah
(74) *Attorney, Agent, or Firm* — Lerner, David, Littenberg, Krumholz & Mentlik, LLP

(57) ABSTRACT

The present invention relates to an ultraviolet curable ink composition including a colorant, an epoxy monomer, an oxetane monomer, a cationic photopolymerization initiator, and a polymerization inhibitor, wherein the weight ratio of epoxy monomer:oxetane monomer is 1:0.5 to 1:6, to a method for forming a bezel pattern by using the same, to a bezel pattern manufactured thereby, and to a display substrate having the same.

12 Claims, No Drawings

(51) Int. Cl.
*G02F 1/1333* (2006.01)
*B41J 2/01* (2006.01)
*B41J 2/21* (2006.01)
*B41J 11/00* (2006.01)

(56) References Cited

U.S. PATENT DOCUMENTS

| | | | |
|---|---|---|---|
| 2006/0128823 A1* | 6/2006 | Tsuchimura | C09D 11/328 |
| | | | 522/71 |
| 2010/0080925 A1* | 4/2010 | Araki | C09D 11/324 |
| | | | 524/88 |
| 2010/0209845 A1 | 8/2010 | Kubota et al. | |
| 2010/0233446 A1* | 9/2010 | Kawashima | C09D 11/101 |
| | | | 522/181 |
| 2010/0304098 A1 | 12/2010 | Ohno et al. | |
| 2011/0190418 A1* | 8/2011 | Noguchi | C09D 11/324 |
| | | | 523/400 |
| 2012/0147095 A1 | 6/2012 | Miura et al. | |
| 2014/0084141 A1 | 3/2014 | Akiyama et al. | |
| 2015/0125789 A1 | 5/2015 | Park et al. | |
| 2016/0108263 A1 | 4/2016 | Yoo et al. | |
| 2017/0198157 A1 | 7/2017 | Park et al. | |
| 2017/0283634 A1* | 10/2017 | Park | B41J 11/002 |
| 2018/0120699 A1* | 5/2018 | Jeon | G03F 7/40 |

FOREIGN PATENT DOCUMENTS

| | | |
|---|---|---|
| CN | 102585596 A | 7/2012 |
| CN | 102796417 A | 11/2012 |
| CN | 105524526 A | 4/2016 |
| CN | 107001824 A | 8/2017 |
| JP | H10020493 A | 1/1998 |
| JP | 2005178330 A | 7/2005 |
| JP | 2006299148 A | 11/2006 |
| JP | 2011095701 A | 5/2011 |
| JP | 2011157514 A | 8/2011 |
| JP | 2014065875 A | 4/2014 |
| JP | 2015189947 A | 11/2015 |
| JP | 5857710 B2 | 2/2016 |
| JP | 2016027127 A | 2/2016 |
| JP | 6095023 B2 | 3/2017 |
| KR | 20150143071 A | 12/2015 |
| KR | 20160037122 A | 4/2016 |
| KR | 20160037126 A | 4/2016 |
| WO | 2009008226 A1 | 1/2009 |
| WO | 2016039986 A1 | 3/2016 |
| WO | 2016093672 A1 | 6/2016 |

OTHER PUBLICATIONS

Chinese Search Report for Chinese Application No. 201880017353.9 dated Aug. 16, 2021, 3 pgs.

* cited by examiner

ULTRAVIOLET CURABLE INK COMPOSITION, METHOD FOR MANUFACTURING BEZEL PATTERN IN DISPLAY SUBSTRATE BY USING SAME, AND BEZEL PATTERN MANUFACTURED THEREBY

CROSS-REFERENCE TO RELATED APPLICATIONS

The present application is a national phase entry under 35 U.S.C. § 371 of International Application No. PCT/KR2018/016617, filed on Dec. 26, 2018, which claims priority from Korean Patent Application No. 10-2017-0180728, filed on Dec. 27, 2017, the disclosures of which are incorporated by reference herein.

FIELD OF THE INVENTION

The present invention relates to a cationic photopolymerizable ultraviolet curable ink composition having excellent reaction stability, a method for manufacturing a bezel pattern for a display substrate using the same, and a bezel pattern manufactured thereby.

BACKGROUND OF THE INVENTION

Metal wiring for driving a device is located around a display device such as a TV or a monitor. Conventionally, a separate bezel structure is provided to cover it. However, in recent years, a method of directly printing a light-shielding bezel pattern on a substrate by using a printing method such as an ink jet is used in order to attain lightening and thinning.

Korean Patent Application Laid-Open No. 2015-0143071 discloses a composition for printing a bezel pattern which enables to perform an inkjet process at a temperature close to room temperature and exhibits excellent adhesion property to a glass substrate. However, in the composition, a oxonium salt is decomposed by irradiation of light energy, and the resulting Lewis acid (cation) initiates a polymerization reaction, which causes a thickening problem because the oxonium salt is decomposed to form Lewis acid even when the composition is stored at a high temperature.

Therefore, it is required to develop a ultraviolet curable ink composition having excellent reaction stability, such as maintaining stability of the composition even at a high temperature is required.

PRIOR ART LITERATURE

Patent Literature (Patent Literature 1) Korean Patent Application Laid-Open No. 2015-0143071

SUMMARY OF THE INVENTION

It is an object of the present invention to provide a ultraviolet curable ink composition which enables to provide a bezel with a small taper angle and a thin film thickness when forming a bezel pattern, and a ultraviolet curable ink composition excellent in reaction stability even at a high temperature.

In order to achieve the above object, the present invention provides a ultraviolet curable ink composition comprising a colorant, an epoxy monomer, an oxetane monomer, a cationic photopolymerization initiator and a polymerization inhibitor, wherein a weight ratio of the epoxy monomer:the oxetane monomer is 1:0.5 to 1:6.

The present invention also provides a method of manufacturing a bezel pattern for a display substrate, comprising the steps of: a) forming a bezel pattern on a substrate using the ultraviolet curable ink composition; and b) curing the bezel pattern.

The present invention also provides a bezel pattern for a display substrate formed on the substrate by curing the ultraviolet curable ink composition.

The present invention also provides a display substrate comprising the bezel pattern.

Effect of the Invention

According to the present invention, by using a ultraviolet curable ink composition that exhibits a small taper angle and a thin film thickness when cured, a bezel pattern that does not exhibit short-circuit due to a large step, bubble generation, and deterioration of visual quality due to film release can be manufactured.

In addition, the ultraviolet curable ink composition according to the present invention is excellent in thermal stability and therefore it can provide a bezel pattern which exhibits excellent curing properties at the same time without exhibiting deterioration such as viscosity increase or phase change to solid due to natural curing reaction even when stored for a long time at high temperature.

DETAILED DESCRIPTION OF THE INVENTION

Hereinafter, the present invention will be described in more detail.

Since various modifications and variations can be made in the present invention, particular embodiments are illustrated in the drawings and will be described in detail in the detailed description. It should be understood, however, that the invention is not intended to be limited to the particular embodiments, but includes all modifications, equivalents, and alternatives falling within the spirit and scope of the invention. In the following description of the present invention, detailed description of known functions will be omitted if it is determined that it may obscure the gist of the present invention.

The present invention provides a ultraviolet curable ink composition comprising a colorant, an epoxy monomer, an oxetane monomer, a cationic photopolymerization initiator and a polymerization inhibitor, wherein a weight ratio of the epoxy monomer:the oxetane monomer is 1:0.5 to 1:6.

As the colorant, one or more pigments, dyes, or a mixture thereof can be used, and there is no particular limitation so long as it can express colors as required.

In one embodiment of the present invention, as a black pigment, carbon black, graphite, metal oxides and organic black pigments can be used.

Examples of carbon black include Cisto 5HIISAF-HS, Cisto KH, Cisto 3HHAF-HS, Cisto NH, Cisto 3M, Cisto 300HAF-LS, Cisto 116HMMAF-HS, Cisto 116MAF, Cisto FMFEF-HS, Cisto SOFEF, Cisto VGPF, Cisto SVHSRF-HS, and Cisto SSRF (Donghae Carbon Co., Ltd.); diagram black II, diagram black N339, diagram black SH, diagram black H, diagram LH, diagram HA, diagram SF, diagram N550M, diagram M, diagram E, diagram G, diagram R, diagram N760M, diagram LR, #2700, #2600, #2400, #2350, #2300, #2200, #1000, #980, #900, MCF88, #52, #50, #47, #45, #45L, #25, #CF9, #95, #3030, #3050, MA7, MA77, MA8, MA11, MA100, MA40, OIL7B, OIL9B, OIL11B, OIL30B and OIL31B (Mitsubishi Chemical Corporation); PRINTEX-U, PRINTEX-V, PRINTEX-140U, PRINTEX-140V, PRINTEX-95, PRINTEX-85, PRINTEX-75, PRINTEX-55, PRINTEX-45, PRINTEX-300, PRINTEX-35, PRINTEX-25, PRINTEX-200, PRINTEX-40, PRINTEX-30, PRINTEX-3, PRINTEX-A, SPECIAL BLACK-550, SPECIAL BLACK-350, SPECIAL BLACK-250, SPECIAL BLACK-100, and LAMP BLACK-101 (Degussa Co., Ltd.); RAVEN-1100ULTRA, RAVEN-1080ULTRA, RAVEN-1060ULTRA, RAVEN-1040, RAVEN-1035, RAVEN-1020, RAVEN-1000, RAVEN-890H, RAVEN-890, RAVEN-880ULTRA, RAVEN-860ULTRA, RAVEN-850, RAVEN-820, RAVEN-790ULTRA, RAVEN-780ULTRA, RAVEN-760ULTRA, RAVEN-520, RAVEN-500, RAVEN-460, RAVEN-450, RAVEN-430ULTRA, RAVEN-420, RAVEN-410, RAVEN-2500ULTRA, RAVEN-2000, RAVEN-1500, RAVEN-1255, RAVEN-1250, RAVEN-1200, RAVEN-1190ULTRA, RAVEN-1170 (Columbia Carbon Co.), mixtures thereof, or the like.

Examples of the organic black pigment include aniline black, lactam black, perylene black, and the like, but it is not limited thereto.

In the present invention, the ultraviolet curable ink composition is cured by irradiation with ultraviolet rays (e.g., 250 or 450 nm), more preferably ultraviolet rays with a long wavelength (e.g., 360 to 410 nm) to have a certain level of optical density (OD). For this purpose, the content of the colorant is preferably 1 to 15% by weight, more preferably 3 to 10% by weight based on the total weight of the ultraviolet curable ink composition. If the content of the colorant is less than 1% by weight, a level of OD applicable to the bezel pattern may not be obtained, and if the content exceeds 15% by weight, an excessive amount of colorant may not be dispersed in the ink, so that precipitates may be formed.

When the content of the colorant is within the above range, the OD value can be maintained in the range of 0.05 to 2.5 on the basis of the film thickness of 1.0 µm.

In general, a radical polymerizable compound and a cationic polymerizable compound are mainly used in the ultraviolet curable ink composition. In the case of the radical polymerizable compound, it is not suitable for curing of thin films because it is subject to curing trouble due to oxygen, and it is not suitable for forming a bezel pattern because it has a low adhesion to a glass substrate due to a large curing shrinkage. On the other hand, in the case of the cationic polymerizable compound, it is advantageous for curing a thin film because the curing shrinkage ratio is generally low and the influence by oxygen is small.

The ultraviolet curable ink composition according to the present invention comprises an epoxy monomer as a cationic curable component. The epoxy monomer may be specifically at least one selected from a bisphenol type epoxy monomer, a novolac type epoxy monomer, a glycidyl ester type epoxy monomer, a glycidyl amine type epoxy monomer, a linear aliphatic epoxy monomer, a biphenyl type epoxy monomer, and an alicyclic epoxy monomer.

The alicyclic epoxy compound may refer to a compound containing at least one epoxidized aliphatic ring group.

In the above-mentioned alicyclic epoxy compound containing the epoxidized aliphatic ring group(s), the epoxidized aliphatic ring group refers to an epoxy group bonded to an alicyclic ring. Examples thereof include a functional group such as a 3,4-epoxycyclopentyl group, a 3,4-epoxycyclohexyl group, a 3,4-epoxycyclopentylmethyl group, a 3,4-epoxycyclohexylmethyl group, a 2-(3,4-epoxycyclopentyl)ethyl group, a 2-(3,4-epoxycyclohexyl)ethyl group, a 3-(3,4-epoxycyclopentyl)propyl group or a 3-(3,4-epoxycyclohexyl)propyl group. The hydrogen atom constituting the alicyclic ring may be optionally substituted with a substituent such as an alkyl group. The alicyclic epoxy compound includes the compounds specifically exemplified below, but is not limited to thereto.

There may be used, for example, dicyclopentadiene dioxide, cyclohexene oxide, 4-vinyl-1,2-epoxy-4-vinylcyclohexene, vinylcyclohexene dioxide, limonene monoxide, limonene dioxide, (3,4-epoxycyclohexyl)methyl-3,4-epoxycyclohexanecarboxylate, 3-vinylcyclohexene oxide, bis(2,3-epoxycyclopentyl)ether, bis(3,4-epoxycyclohexylmethyl)adipate, bis(3,4-epoxy-6-methylcyclohexylmethyl) adipate, (3,4-epoxycyclohexyl)methyl alcohol, (3,4-epoxy-6-methylcyclohexyl)methyl-3,4-epoxy-6-methylcyclohexanecarboxylate, ethylene glycol bis(3,4-epoxycyclohexyl)ether, 3,4-epoxycyclohexene carboxylic acid ethylene glycol diester, (3,4-epoxycyclohexyl)ethyltrimethoxysilane and Celloxide 8000 from Daicel.

The content of the epoxy monomer may be preferably 5 to 60% by weight, more preferably 10 to 30% by weight based on the total weight of the ultraviolet curable ink composition. If the content of the epoxy monomer exceeds 60% by weight, the viscosity of the ink composition increases, and if the content of the epoxy monomer is less than 5% by weight, curing sensitivity is deteriorated.

The ultraviolet curable ink composition comprises an oxetane monomer as another cationic polymerizable monomer.

The oxetane monomer, which is a compound having a quaternary cyclic ether group in the molecular structure, may serve to lower the viscosity of the cationically cured ink composition (e.g., less than 50 cP at 25° C.).

In particular, there may be exemplified by 3-ethyl-3-hydroxymethyloxetane, 1,4-bis[(3-ethyl-3-oxetanyl)methoxymethyl]benzene, 3-ethyl-3-(phenoxymethyl)oxetane, di[(3-ethyl-3-oxetanyl)methyl]ether, 3-ethyl-3-[(2-ethylhexyloxy)methyl]oxetane, 3-ethyl-3-cyclohexyloxymethyl oxetane and phenol novolak oxatane. Examples of the oxetane compound include "ARON OXETANE OXT-101", "ARON OXETANE OXT-121", "ARON OXETANE OXT-211", "ARON OXETANE OXT-221", "ARON OXETANE OXT-212" and the like from Toagosei Co., Ltd. These may be used alone or in combination of two or more.

The content of the oxetane monomer is preferably 15 to 80% by weight, and more preferably 40 to 60% by weight based on the total weight of the ultraviolet curable ink composition. If it is more than 80% by weight, the curing sensitivity is low, and if it is less than 15% by weight, the viscosity increases and coating properties are deteriorated.

Further, the oxetane monomer of the present invention can be used in combination with an oxetane compound having one oxetane ring and an oxetane compound having two oxetane rings. When the oxetane compound having one oxetane ring and the oxetane compound having two oxetane rings are used together, the viscosity and flexibility of the film can be controlled. When two kinds of oxetane compounds are used together as described above, it is preferred that the content range of the oxetane compound having one oxetane ring: the oxetane compound having two oxetane rings is in the range of 1:16 to 1:3.

Further, the present invention is characterized in that the content ratio of the epoxy monomer:the oxetane monomer is 1:0.5 to 1:6. When the ratio of the epoxy compound to the oxetane compound is more than 1:6, the viscosity of the composition is low and coating property of the composition is excellent, but curing sensitivity may be lowered. When the ratio is less than 1:0.5, coating property may be deteriorated due to high viscosity of the composition.

The ink composition of the present invention comprises a compound which produces a cationic species or a Bronsted acid by irradiation of UV rays as a cationic photopolymerization initiator, for example, but not limited to, an iodonium salt or a sulfonium salt.

The iodonium salt or the sulfonium salt causes a curing reaction in which monomers having unsaturated double bond(s) contained in the ink composition are reacted to produce a polymer during the UV curing process. A photosensitizer may be used depending on the polymerization efficiency.

As an example, the photopolymerization initiator may be a photopolymerization initiator having an anion represented by $SbF_6^-$, $AsF_6^-$, $BF_6^-$, $(C_6F_5)_4B^-$, $PF_6^-$ or $RfnF_{6-n}$, but is not limited thereto.

The photopolymerization initiator is preferably contained in an amount of 1 to 15% by weight, more preferably 2 to 10% by weight based on the total weight of the ultraviolet curable ink composition. If the content of the photopolymerization initiator is less than 1% by weight, the curing reaction may not be sufficient. If the content of the photopolymerization initiator is more than 15% by weight, it may not be dissolved completely or the viscosity may be increased and coating property may be deteriorated.

The ultraviolet curable ink composition of the present invention comprises a polymerization inhibitor to improve storage stability. In one embodiment of the present invention, the polymerization inhibitor may be an amine compound. The amine compound is preferred because it reduces the viscosity change of the composition during storage at high temperature and/or long-term storage.

The polymerization inhibitor to be used in the ink composition according to the present invention may be used alone or in a mixture of two or more.

In one embodiment of the present invention, the amine compound may be a monovalent amine having one nitrogen atom or a divalent amine having two nitrogen atoms.

In one embodiment of the present invention, the amine compound may be a primary amine, a secondary amine or a tertiary amine, preferably a tertiary amine.

In one embodiment of the present invention, the amine compound has a functional group bonded to a nitrogen atom, which may be at least one selected from the group consisting of (C1-C6) alkyl, (C2-C6) alkenyl, (C2-C6) alkynyl, phenyl, (C1-C6) ketone, (C1-C6) ether and (C1-C6) ester, and the functional group may be substituted with one or more substituents consisting of a amide group, a cyan group, a carboxyl group, an aldehyde group and a hydroxy group.

In one embodiment of the present invention, the amine compound may be a tertiary amine in which the functional group bonded to the nitrogen atom is (C1-C6) alkyl, wherein any one of the functional groups is substituted with hydroxy, as shown in the formula 1.

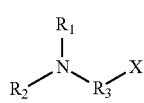

[Formula 1]

In the formula 1, $R_1$ and $R_2$ are, independently of each other, (C1-C6) alkyl, $R_3$ is (C1-C6) alkylene and X is hydroxy.

In one embodiment of the present invention, $R_1$ and $R_2$ of the formula 1 are, independently of each other, (C1-C3) alkyl, $R_3$ is (C1-C3) alkylene and X is hydroxy.

In one embodiment of the present invention, $R_1$ and $R_2$ of the formula 1 are, independently of each other, methyl, $R_3$ is (C1-C3) alkylene and X is hydroxy.

In one embodiment of the present invention, the amine compound may be di(C1-C6)alkylamino(C1-C6)alkanol, for example, at least one selected from the group consisting of dimethylaminomethanol (DMAMA) of the following formula 2, 2-dimethylaminoethanol (2-DMAEA) of the following formula 3, and 3-dimethylamino-1-propanol (3-DMA-I-PA) of the following formula 4.

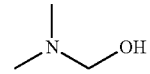

[Formula 2]

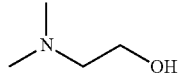

[Formula 3]

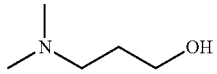

[Formula 4]

The content of the polymerization inhibitor is preferably from 0.2 to 4.9% by weight based on the total weight of the ultraviolet curable ink composition, because viscosity change is small even in long-term storage, and more preferably 0.3 to 3.0% by weight.

The ink composition according to the present invention may further comprise at least one selected from the group consisting of a diluting solvent, an adhesion promoter, a surfactant and a photosensitizer, if necessary.

The diluting solvent is intended to improve coating property by decreasing the viscosity of the ink composition to increase the flowability. Examples of the diluting solvent include but not limited to methyl ethyl ketone, methyl cellosolve, ethyl cellosolve, ethylene glycol dimethyl ether, ethylene glycol diethyl ether, propylene glycol dimethyl ether, propylene glycol diethyl ether, diethylene glycol dimethyl ether, diethylene glycol diethyl ether, diethylene glycol methyl ethyl ether, 2-ethoxypropanol, 2-methoxypropanol, 2-ethoxyethanol, 3-methoxybutanol, cyclohexanone, cyclopentanone, propylene glycol methyl ether acetate, propylene glycol ethyl ether acetate, 3-methoxybutyl acetate, ethyl 3-ethoxypropionate, ethyl cellosolve acetate, methyl cellosolve acetate, butyl acetate, dipropylene glycol monomethyl ether, cyclohexene oxide and propylene carbonate.

The content of the diluting solvent is preferably 0 to 30% by weight, more preferably 0.1 to 20% by weight based on the total weight of the ultraviolet curable ink composition. If it is more than 30% by weight, curing sensitivity is lowered.

The ultraviolet curable ink composition may further comprise an adhesion promoter as an additive.

The film attached on the bezel pattern is repeatedly subjected to shrinkage and expansion depending on conditions of use such as temperature and humidity, so that the bezel pattern is stressed, and the film and the bezel may be separated from the glass substrate. In order to prevent this, at least one silane compound selected from the group consisting of an alkoxysilane compound, an epoxy silane compound, an aminophenyl silane compound, an amino silane compound, a mercapto silane compound and a vinyl silane compound is used as the adhesion promoter. When such silane compounds are used, excellent results can be obtained.

Among them, an epoxy silane compound is more preferable as the adhesion promoter of the present invention.

The adhesion promoter is preferably contained in an amount of 0.1 to 15% by weight, more preferably 2 to 10% by weight based on the total weight of the ink composition. If it is less than 0.1% by weight, the bezel pattern can not be prevented from being peeled off from the glass substrate. If it exceeds 15% by weight, the viscosity of the ink solution increases and the dispersibility is low.

The ultraviolet curable ink composition may further comprise a surfactant that lowers the surface tension of the ink composition to exhibit a small taper angle.

As the surfactant, a commercially available product can be used, for example Megafack F-444, F-475, F-478, F-479, F-484, F-550, F-552, F-553, F-555, F-570 and RS-75 from DIC(DaiNippon Ink & Chemicals), or Surflon S-111, S-112, S-113, S-121, S-131, S-132, S-141 and S-145 from Asahi Glass Co., Ltd., or Fluorad FC-93, FC-95, FC-98, FC-129, FC-135, FC-170C, FC-430 and FC-4430 from Sumitomo 3M Co., Ltd., or Zonyl FS-300, FSN, FSN-100 and FSO from DuPont, or BYK-306, BYK-310, BYK-320, BYK-331, BYK-333, BYK-342, BYK-350, BYK-354, BYK-355, BYK-356, BYK-358N, BYK-359, BYK-361N, BYK-381, BYK-370, BYK-371, BYK-378, BYK-388, BYK-392, BYK-394, BYK-399, BYK-3440, BYK-3441, BYKETOL-AQ, BYK-DYNWET 800, BYK-SILCLEAN 3700 and BYK-UV 3570 from BYK, or Rad 2100, Rad 2011, Glide 100, Glide 410, Glide 450, Flow 370 and Flow 425 from TEGO, etc.

The surfactant is preferably contained in an amount of 0.1 to 5.0% by weight, more preferably 0.5 to 3.0% by weight based on the total weight of the ultraviolet curable ink composition. If the content of the surfactant is less than 0.1% by weight, the effect of lowering the surface tension of the composition may be insufficient, resulting in coating failure when the composition is coated on the substrate. If the content is more than 5.0% by weight, the surfactant may be used in an excessive amount, resulting in a problem that the compatibility and the defoaming property of the composition may be reduced.

The ultraviolet curable ink composition may further comprise a photosensitizer to compensate curing property for a long wavelength active energy ray.

The photosensitizer may be at least one selected from the group consisting of anthracene-based compounds such as anthracene, 9,10-dibutoxyanthracene, 9,10-dimethoxyanthracene, 9,10-diethoxyanthracene and 2-ethyl-9,10-dimethoxyanthracene; benzophenone-based compounds such as benzophenone, 4,4-bis(dimethylamino)benzophenone, 4,4-bis(diethylamino)benzophenone, 2,4,6-trimethylaminobenzophenone, methyl-o-benzoyl benzoate, 3,3-dimethyl-4-methoxybenzophenone and 3,3,4,4-tetra(t-butylperoxycarbonyl)benzophenone; ketone-based compound such as acetophenone, dimethoxyacetophenone, diethoxyacetophenone, 2-hydroxy-2-methyl-1-phenylpropan-1-one and propanone; perylene; fluorenone-based compounds such as 9-fluorenone, 2-chloro-9-fluorenone and 2-methyl-9-fluorenone; thioxanthone-based compounds such as thioxanthone, 2,4-diethylthioxanthone, 2-chlorothioxanthone, 1-chloro-4-propyloxythioxanthone, isopropylthioxanthone(ITX) and diisopropylthioxanthone; xanthone-based compounds such as xanthone and 2-methylxanthone; anthraquinone-based compounds such as anthraquinone, 2-methyl anthraquinone, 2-ethyl anthraquinone, t-butyl anthraquinone and 2,6-dichloro-9,10-anthraquinone; acridine-based compounds such as 9-phenylacridine, 1,7-bis(9-acridinyl)heptane, 1,5-bis(9-acridinylpentane) and 1,3-bis (9-acridinyl)propane; dicarbonyl compounds such as benzyl, 1,7,7-trimethyl-bicyclo[2,2,1]heptan-2,3-dione and 9,10-phenanthrenequinone; phosphine oxide-based compounds such as 2,4,6-trimethylbenzoyl diphenyl phosphine oxide and bis(2,6-dimethoxybenzoyl)-2,4,4-trimethylpentyl phosphine oxide; benzoate-based compounds such as methyl-4-(dimethylamino)benzoate, ethyl-4-(dimethylamino)benzoate and 2-n-butoxyethyl-4-(dimethylamino) benzoate; amino synergists such as 2,5-bis(4-diethylaminobenzal)cyclopentanone, 2,6-bis(4-diethylaminobenzal) cyclohexanone and 2,6-bis(4-diethylaminobenzal)-4-methyl-cyclopentanone; coumarine-based compounds such as 3,3-carbonylvinyl-7-(diethylamino)coumarine, 3-(2-benzothiazolyl)-7-(diethylamino)coumarine, 3-benzoyl-7-(diethylamino)coumarine, 3-benzoyl-7-methoxy-coumarine and 10,10-carbonylbis[1,1,7,7-tetramethyl-2,3,6,7-tetrahydro-1H,5H,11H-C1]-bezopyrano[6,7,8-ij]-quinolizin-11-one; chalcone compounds such as 4-diethylamino chalcone and 4-azidobenzalacetophenone; 2-benzoylmethylene; and 3-methyl-b-naphtothiazoline.

The photosensitizer is preferably contained in an amount of 1 to 200 parts by weight, more preferably 10 to 100 parts by weight, based on 100 parts by weight of the photopolymerization initiator. If the amount is less than 1 part by weight, a synergistic effect of curing sensitivity at a desired wavelength could not be expected. If the amount is more than 200 parts by weight, the photosensitizer may not be dissolved and the adhesive strength and crosslinking density of the pattern may be lowered.

The ultraviolet curable ink composition used in the present invention spreads within a short time after inkjet printing, exhibits excellent coating properties, and exhibits excellent adhesion properties by curing. Therefore, when the ultraviolet curable ink composition is applied to an inkjet printer, it is preferable to provide a UV lamp just behind the inkjet head so that curing can be performed simultaneously with inkjet printing.

The ultraviolet curable ink composition has an exposure dose for curing of 1 to 10,000 mJ/cm$^2$, preferably 80 to 2,000 mJ/cm$^2$.

The ultraviolet curable ink composition is cured by absorbing radiation in a wavelength range of 250 nm to 450 nm, preferably 360 nm to 410 nm.

The ultraviolet curable ink composition, for example, having a viscosity of 1 cP to 50 cP at 25° C., preferably 3 cP to 45 cP at 25° C., is suitable for an inkjet process. The ultraviolet curable ink composition having the above-described viscosity range has good jetting at a process temperature. The process temperature means a temperature heated in order to lower viscosity of the curable ink composition. The process temperature may be from 10° C. to 100° C., and preferably from 20° C. to 70° C.

The ultraviolet curable ink composition is excellent in stability in a state where it is stored at a high temperature of 60° C. or more, at a temperature higher than room temperature of 30° C., or at room temperature. For example, when the ink composition is stored at 45° C. for 3 months, the viscosity increasing rate is 100% or less.

The ultraviolet curable ink composition has excellent adhesion to a glass substrate and excellent coating properties.

In addition, the bezel pattern formed according to the present invention with the ultraviolet curable ink composition has excellent adhesion to the upper substrate.

The upper end of the bezel pattern formed by the ultraviolet curable ink composition is attached to the upper substrate via the adhesive layer for upper substrate. The ultraviolet curable ink composition has an excellent adhesive force with an adhesive for upper substrate such as an acrylic adhesive, a styrene butadiene rubber adhesive, an epoxy adhesive, a polyvinyl alcohol adhesive and a polyurethane adhesive. Therefore, when the ultraviolet curable ink composition as described above is used, the adhesion between the bezel pattern and the upper substrate can be improved.

The method of manufacturing a bezel pattern for a display substrate according to the present invention uses the ultraviolet curable ink composition.

Specifically, the method of manufacturing a bezel pattern for a display substrate according to the present invention comprises the steps of: a) forming a bezel pattern on a substrate using the ultraviolet curable ink composition; and b) curing the bezel pattern.

In addition, the method of manufacturing a bezel pattern of a display substrate of the present invention may further comprises a step of cleaning and drying the substrate before the step a) of forming the bezel pattern. This is for selectively performing the surface treatment depending on the surface energy of the substrate to improve coatability of the ink and remove stains due to foreign substances.

Specifically, the surface treatment can be carried out by a treatment such as wet surface treatment, UV ozone, atmospheric plasma or the like.

As a method of forming a bezel pattern on the substrate, a method selected from inkjet printing, gravure coating and reverse offset coating may be used instead of photolithography and screen printing. In order to apply the above method, the viscosity of the ink composition of the present invention may be 1 cP to 50 cP, preferably 3 cP to 45 cP.

The ink composition having a low viscosity of 1 cP to 50 cP is applied at a height of 0.1 to 20 μm, more specifically 0.5 to 5 μm to form a bezel pattern on particular portion of the substrate by the above method. The applied composition is cured through exposure including ultraviolet rays, so that a bezel pattern having a thin film thickness of 0.1 to 20 μm, more specifically 0.5 to 5 μm can be produced.

Examples of the light source for curing the ultraviolet curable ink composition of the present invention include mercury vapor arc, carbon arc, Xe arc and LED curing machine which emit light having a wavelength of 250 to 450 nm, but are not limited thereto.

The bezel pattern may have, as measured after curing, a taper angle of greater than 0° to 30° and a thickness of 0.1 to 20 μm. In addition, the taper angle may preferably be greater than 0° to 10°, and the thickness may preferably be 0.5 to 5 μm. The bezel pattern of the present invention may not exhibit short-circuit due to a large step, bubble generation, and deterioration of visual quality due to film release.

The optical density of the bezel pattern may be 0.05 to 2.5 on the basis of the film thickness of 1.0 μm, or 0.1 to 1.0, if necessary. In this case, there is an advantage that the shielding properties due to the bezel pattern are excellent. If the optical density exceeds 2.5, the required content of the pigment to be added becomes very high, which may adversely affect the production of the ink and the inkjet process and may inhibit the ultraviolet curable ink composition from being cured by radiation.

The present invention provides a bezel pattern of a display substrate manufactured by the above method. In the present invention, the bezel pattern refers to a pattern formed at the edges of various devices such as a watch, a display device, and the like.

The bezel pattern may have, as measured after curing, a taper angle of greater than 0° to 30° and a thickness of 0.1 to 20 μm. In addition, the taper angle may preferably be greater than 0° to 10°, and the thickness may preferably be 0.5 to 5 μm. The bezel pattern of the present invention may not exhibit short-circuit due to a large step, bubble generation, and deterioration of visual quality due to film release.

The optical density of the bezel pattern may be 0.05 to 2.5 on the basis of the film thickness of 1.0 μm, or 0.25 to 1.0, if necessary. In this case, there is an advantage that the shielding properties due to the bezel pattern are excellent. If the optical density exceeds 2.5, the required content of the pigment to be added becomes very high, which may adversely affect the production of the ink and the inkjet process and may inhibit the ultraviolet curable ink composition from being cured by radiation.

The present invention also provides a display substrate comprising the bezel pattern. The display may be used in any one selected from a plasma display panel (PDP), a light emitting diode (LED), an organic light emitting diode (OLED), a liquid crystal display (LCD), a thin film transistor-liquid crystal display (LCD-TFT) and a cathode ray tube (CRT).

It will be apparent to those skilled in the art that various modifications and variations can be made in the present invention without departing from the spirit or scope of the invention as set forth in the appended claims. Such changes and modifications are intended to be within the scope of the appended claims.

Examples

Experimental Example 1: Storage Stability

The photopolymerizable ultraviolet curable ink compositions of Examples 1 and 2 according to the present invention and the photopolymerizable ultraviolet curable ink compositions of Comparative Examples 1 to 8 in which only the amount of the polymerization inhibitor was changed from Example 2 were prepared in an amount of gram as shown in the following Table 1. The composition was injected into a 20 cc brown glass bottle vessel in an amount of about 15 cc, which was ¾ thereof, and then the stability was evaluated. Each vessel was kept in a convection oven kept constant at 45° C. for 1 to 3 months and the viscosity of the composition in each vessel was measured using Viscometer DV-2 (Brookfield) at 25° C.

The results are shown in Table 2. When the thickening rate (viscosity increasing amount/initial viscosity) of the composition is 200% or more, it is indicated by X. When the thickening rate (viscosity increasing amount/initial viscosity) of the composition is 100 to 200%, it is indicated by A. When the thickening rate (viscosity increasing amount/initial viscosity) of the composition is 100% or less, it is indicated by ○.

Experimental Example 2: Curing Sensitivity

A cationic photopolymerizable composition was prepared according to the above Examples 1 to 2 and Comparative Examples 1 to 8. A glass substrate for display (EAGLE XG, Corning) was chamfered to a size of 100 mm×100 mm, immersed in acetone, isopropyl alcohol and ultrapure water in order for 5 minutes, respectively, to perform ultrasonic cleaning, followed by drying at 120° C. for 30 minutes. 1 ml each of the cationic photopolymerizable compositions was dropped onto the glass substrate. Then, a film was formed to a thickness of about 5 μm using a Meyer bar and then cured using a UV-LED curing machine (wavelength: 395 nm, ~1000 mW/cm$^2$). According to the time taken until the greasy or sticky unreacted material remains on the surface of the coated film, A is the case where the surface of the coated film is fully cured after 1 second exposure (exposure dose: 1000 mJ/cm$^2$), B is the case where the case where the surface of the coated film is fully cured after 3 seconds exposure (exposure dose: 3000 mJ/cm$^2$), and C is the case where exposure for 3 seconds or more is required. The case A and the case B are evaluated as good results.

present invention were excellent in storage stability and thus were suitable for the present invention.

On the contrary, the composition of Comparative Example 1 in which the content of the polymerization inhibitor is too low, had a poor storage stability and had the same level of curing sensitivity within a minimum exposure dose for curing of 1,000 mJ/cm$^2$, compared with the compositions of Examples 1 and 2. The composition of Comparative Example 2 in which the content of the polymerization inhibitor is too high, was excellent in stability, but the curing sensitivity was poor because an exposure dose of 3000 mJ/cm$^2$ or more was required.

In Comparative Examples 3 and 8 where trivalent or more amine is used as the polymerization inhibitor, storage stability was poor. In Comparative Example 7 where the terminal of two or more functional groups substituted on the

TABLE 1

| | Composition | Example 1 | Example 2 | Comparative Example 1 | 2 | 3 | 4 | 5 | 6 | 7 | 8 |
|---|---|---|---|---|---|---|---|---|---|---|---|
| Composition | Black pigment (C.I. Pigment Black 7) | 5 | | | | | 10 | | | | |
| | Epoxy monomer (Celloxide 2021P, Daicel) | 20 | | | | | 10 | | | | |
| | Oxetane monomer (ARON OXETANE OXT-221, TOAGOSEI) | 45 | | | | | 50 | | | | |
| | Diluting solvent (Diethylene glycol, DAEJUNG) | 10 | | | | | 10 | | | | |
| | Photopolymerization initiator (Speedcure 920, Lamberti) | 4 | | | | | 4 | | | | |
| Polymerization inhibitor | 3-DMA-1 PA (Sigma Aldrich) | 1 | | 0.1 | | 5 | | | | | |
| | 2-DMAEA (Sigma Aldrich) | | 2 | | | | | | | | |
| | DETA (Sigma Aldrich) | | | | | | 1 | | | | |
| | BHT (Sigma Aldrich) | | | | | | 1 | | | | |
| | MEHQ (Sigma Aldrich) | | | | | | | 1 | | | |
| | Irganox 1035 (BASF) | | | | | | | | 1 | | |
| | TIPA (Sigma Aldrich) | | | | | | | | | 1 | |
| | TETA (Sigma Aldrich) | | | | | | | | | | 1 |

3-DMA-1PA: 3-dimethylamino-1-propanol
2-DMAEA: 2-dimethylamino ethanol
DETA: Diethylene triamine
TETA: Triethylene tetramine
TIPA: Triisopropanolamine
BHT: Butylate hydroxy toluene
MEHQ: 4-Methoxyphenol

TABLE 2

| | | Example 1 | Example 2 | Comparative Example 1 | 2 | 3 | 4 | 5 | 6 | 7 | 8 |
|---|---|---|---|---|---|---|---|---|---|---|---|
| Stability | After 1 month | ○ | ○ | ○ | ○ | ○ | Δ | x | x | ○ | x |
| | After 2 months | ○ | ○ | Δ | ○ | Δ | x | x | x | x | x |
| | After 3 months | ○ | ○ | x | ○ | x | x | x | x | x | x |
| Curing sensitivity | | A | A | A | C | B | A | A | B | B | C |

From the results shown in Table 2, it was confirmed that the compositions of Examples 1 and 2 according to the tertiary amine is a hydroxy group, the curing sensitivity was moderate but the storage stability was poor.

The compositions of Comparative Examples 4, 5 and 6, in which an antioxidant compound which is a polymerization inhibitor widely used in conventional radical photopolymerizable acrylic compound is used, were not significantly different in curing sensitivity, but had poor storage stability.

While the present invention has been particularly shown and described with reference to the particular embodiments thereof, it will be apparent to those skilled in the art that these specific descriptions are only preferred embodiments and that the scope of the invention is not limited thereby. Accordingly, the actual scope of the present invention will be defined by the appended claims and their equivalents.

What is claimed is:

1. A ultraviolet curable ink composition comprising a colorant, an epoxy monomer, an oxetane monomer, a cationic photopolymerization initiator and a polymerization inhibitor, wherein a weight ratio of the epoxy monomer to the oxetane monomer is 1:0.5 to 1:6, wherein the polymerization inhibitor is an amine compound, wherein the amine compound is di(C1-C6) alkylamino (C1-C6) alkanol, and wherein the viscosity of the ink composition increases at a rate of 100% or less when the ink composition is stored at 45° C. for 3 months.

2. The ultraviolet curable ink composition according to claim 1, wherein the composition further comprises at least one selected from the group consisting of a diluting solvent, an adhesion promoter, a surfactant and a photosensitizer.

3. The ultraviolet curable ink composition according to claim 1, wherein the amine compound is at least one selected from the group consisting of 2-dimethylaminoethanol (2-DMAEA), 3-dimethylamino-1-propanol (3-DMA-1-PA) and dimethylaminomethanol (DMAMA).

4. The ultraviolet curable ink composition according to claim 1, wherein the polymerization inhibitor is present in an amount of 0.2 to 4.9% by weight based on the total weight of the ultraviolet curable ink composition.

5. The ultraviolet curable ink composition according to claim 1, wherein the ultraviolet curable ink composition has a viscosity of 1 to 50 cP at 25° C.

6. A method of manufacturing a bezel pattern for a display substrate, comprising:
   forming the ultraviolet curable ink composition according to claim 1 on a substrate in the shape of a bezel pattern; and
   curing the ink composition to form the bezel pattern.

7. The method of manufacturing a bezel pattern for a display substrate according to claim 6, wherein the thickness of the bezel pattern is 0.1 to 20 μm after curing.

8. A bezel pattern for a display substrate, the bezel pattern formed by patterning and curing the ultraviolet curable ink composition of claim 1.

9. The bezel pattern for a display substrate according to claim 8, wherein the thickness of the bezel pattern is 0.1 to 20 μm.

10. The bezel pattern for a display substrate according to claim 8, wherein the taper angle of the bezel pattern is 0° to 10°.

11. The bezel pattern for a display substrate according to claim 8, wherein the optical density (OD) of the bezel pattern is 0.05 to 2.5 on the basis of the film thickness of 1.0 μm.

12. A display substrate comprising the bezel pattern according to claim 8.

* * * * *